(12) United States Patent
Kato et al.

(10) Patent No.: US 9,837,976 B2
(45) Date of Patent: Dec. 5, 2017

(54) IMPEDANCE CONVERTING CIRCUIT AND COMMUNICATION TERMINAL APPARATUS

(71) Applicant: Murata Manufacturing Co., Ltd., Nagaokakyo-shi, Kyoto-fu (JP)

(72) Inventors: Noboru Kato, Nagoakakyo (JP); Kenichi Ishizuka, Nagaokakyo (JP); Noriyuki Ueki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 740 days.

(21) Appl. No.: 13/792,469

(22) Filed: Mar. 11, 2013

(65) Prior Publication Data

US 2013/0187824 A1    Jul. 25, 2013

Related U.S. Application Data

(63) Continuation of application No. PCT/JP2012/053747, filed on Feb. 17, 2012.

(30) Foreign Application Priority Data

Feb. 23, 2011   (JP) ................................. 2011-037681
Jun. 22, 2011   (JP) ................................. 2011-137927

(51) Int. Cl.
 *H01Q 1/50* (2006.01)
 *H03H 7/38* (2006.01)
 (Continued)

(52) U.S. Cl.
 CPC .............. *H03H 7/38* (2013.01); *H01Q 1/243* (2013.01); *H01Q 1/50* (2013.01); *H04B 1/0458* (2013.01)

(58) Field of Classification Search
 CPC  H01Q 5/00; H01Q 9/045; H01Q 5/50; H01Q 5/335
 (Continued)

(56) References Cited

U.S. PATENT DOCUMENTS 6,121,940 A * 9/2000 Skahill ................. H01Q 9/00
                                                   343/701
2002/0105474 A1  8/2002 Kitamura et al.
(Continued)

FOREIGN PATENT DOCUMENTS

CN   101460964 A   6/2009
JP   2000-124728 A   4/2000
(Continued)

OTHER PUBLICATIONS

Official Communication issued in International Patent Application No. PCT/JP2012/053747, dated Apr. 17, 2012.

*Primary Examiner* — Dameon E Levi
*Assistant Examiner* — Collin Dawkins
(74) *Attorney, Agent, or Firm* — Keating & Bennett, LLP

(57) ABSTRACT

An impedance converting circuit module includes a first matching circuit, a feeding-circuit-side matching circuit interposed between the first matching circuit and a feeding circuit, and an antenna-side matching circuit interposed between the first matching circuit and a radiating element. The feeding-circuit-side matching circuit performs impedance matching between a feeding port of the feeding circuit and the first matching circuit, and the antenna-side matching circuit performs impedance matching between a port of the radiating element and the first matching circuit.

20 Claims, 16 Drawing Sheets

(51) Int. Cl.
*H04B 1/04* (2006.01)
*H01Q 1/24* (2006.01)

(58) Field of Classification Search
USPC .................................. 343/852, 850, 860
See application file for complete search history.

(56) References Cited

U.S. PATENT DOCUMENTS

| | | | | |
|---|---|---|---|---|
| 2004/0217915 | A1* | 11/2004 | Imaizumi | H03H 7/38 343/860 |
| 2007/0190954 | A1* | 8/2007 | Murakami | H03H 7/38 455/132 |
| 2008/0212552 | A1* | 9/2008 | Fukamachi | H04B 1/0057 370/343 |
| 2008/0266042 | A1* | 10/2008 | Yoshimura | H01F 27/2804 336/181 |
| 2009/0065594 | A1 | 3/2009 | Kato et al. | |
| 2009/0135080 | A1* | 5/2009 | Benthem | H01Q 1/521 343/851 |
| 2010/0090917 | A1* | 4/2010 | Roeckl | H04B 1/18 343/722 |
| 2010/0194658 | A1* | 8/2010 | Yukimoto | H01Q 9/42 343/860 |
| 2012/0194403 | A1* | 8/2012 | Cordier | H03H 7/38 343/853 |

FOREIGN PATENT DOCUMENTS

| | | |
|---|---|---|
| JP | 2002-232313 A | 8/2002 |
| JP | 2004-336250 A | 11/2004 |
| JP | 2005-039446 A | 2/2005 |
| JP | 2005-311929 A | 11/2005 |
| JP | 2006-173697 A | 6/2006 |
| JP | 2008-035065 A | 2/2008 |
| JP | 2010-232957 A | 10/2010 |

* cited by examiner

IMPEDANCE CONVERTING CIRCUIT AND COMMUNICATION TERMINAL APPARATUS

BACKGROUND OF THE INVENTION

1. Field of the Invention

The present invention relates to an impedance converting circuit preferably for use in an antenna device and other devices. In particular, the present invention relates to an impedance converting circuit that provides matching in a wide frequency band, and to a communication terminal apparatus that includes the impedance converting circuit.

2. Description of the Related Art

In recent years, communication terminal apparatuses, such as cellular phones, have often been required to support communication systems, such as Global System for Mobile Communications (GSM) (registered trademark), Digital Communication System (DCS), Personal Communication Services (PCS), and Universal Mobile Telecommunications System (UMTS) as well as Global Positioning System (GPS), wireless LAN, and Bluetooth (registered trademark) and others. Therefore, antenna devices in such communication terminal apparatuses are required to cover a wide frequency band of 700 MHz to 2.7 GHz.

Antenna devices for a wide frequency band typically have a passive matching circuit at a feeding end of an antenna element, as disclosed in Japanese Unexamined Patent Application Publication No. 2004-336250 and Japanese Unexamined Patent Application Publication No. 2006-173697. The passive matching circuit includes passive elements and is formed by an LC parallel resonant circuit or an LC series resonant circuit. Antenna devices that have an active matching circuit including active elements, as disclosed in Japanese Unexamined Patent Application Publication No. 2000-124728 and Japanese Unexamined Patent Application Publication No. 2008-035065, are also known as antenna devices for a wide frequency band.

In general, the impedance of an antenna element varies depending on the size and shape of the antenna element, the surroundings and others. Therefore, the passive matching circuits disclosed in Japanese Unexamined Patent Application Publication No. 2004-336250 and Japanese Unexamined Patent Application Publication No. 2006-173697 need to be adjusted for each model of communication terminal apparatus. In particular, it is not easy to optimize the impedance for each of a plurality of frequency bands. Adjusting the impedance for each of a plurality of frequency bands tends to increase the number of elements included in the matching circuit. Such an increase in the number of elements in the matching circuit may lead to increased insertion loss and make it difficult to obtain a sufficient gain.

The active matching circuits disclosed in Japanese Unexamined Patent Application Publication No. 2000-124728 and Japanese Unexamined Patent Application Publication No. 2008-035065 also need to be adjusted for each model of communication terminal apparatus. Additionally, the active matching circuits require a circuit for controlling a variable capacitance element, that is, require a switching circuit for switching the frequency band. As a result, the circuit configuration tends to become complicated. Also, due to high loss and large distortion in the switching circuit, it may not be possible to obtain a sufficient gain.

SUMMARY OF THE INVENTION

In view of the circumstances described above, preferred embodiments of the present invention provide an impedance converting circuit that can easily optimize the impedance in a wide frequency band, provides low-loss performance, and has a simple configuration, and also provide a communication terminal apparatus that includes the impedance converting circuit.

An impedance converting circuit according to a preferred embodiment of the present invention is connected between a first high-frequency circuit and a second high-frequency circuit. The impedance converting circuit includes a first matching circuit including a first inductance element connected to the first high-frequency circuit, and a second inductance element connected to the second high-frequency circuit and coupled to the first inductance element; and a second matching circuit connected at least between the first matching circuit and the first high-frequency circuit or between the first matching circuit and the second high-frequency circuit, the second matching circuit including a reactance element including at least one of a capacitance element and an inductance element.

A communication terminal apparatus according to another preferred embodiment of the present invention includes a radiating element, and an impedance converting circuit interposed between the radiating element and a feeding circuit. The impedance converting circuit includes a first matching circuit including a first inductance element connected to the feeding circuit, and a second inductance element connected to the radiating element and coupled to the first inductance element; and a second matching circuit connected at least between the first matching circuit and the feeding circuit or between the first matching circuit and the radiating element, the second matching circuit including a reactance element including at least one of a capacitance element and an inductance element.

Various preferred embodiments of the present invention can realize an impedance converting circuit that can provide impedance matching between a first high-frequency circuit and a second high-frequency circuit over a wide frequency band, provides low-loss performance, and has a simple configuration.

Various preferred embodiments of the present invention can also realize a communication terminal apparatus that provides low-loss performance, has a simple configuration, and covers a wide frequency band. Preferred embodiments of the present invention are easily applicable to a communication terminal apparatus for using various communication systems.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1A:
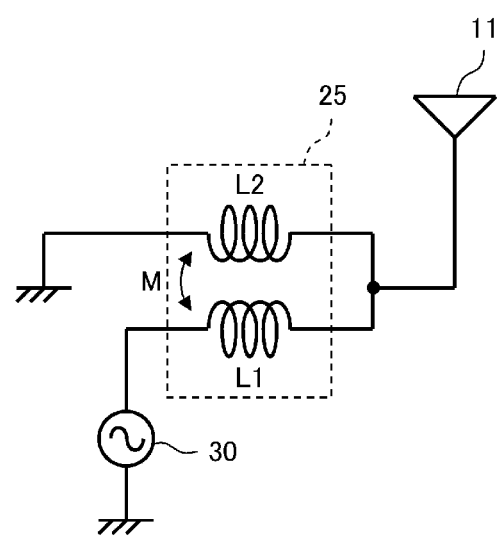
FIG. 1A is a circuit diagram of an antenna device 101 including a first matching circuit 25 for preliminarily describing an impedance converting circuit according to a first preferred embodiment of the present invention.
Figure 1B:
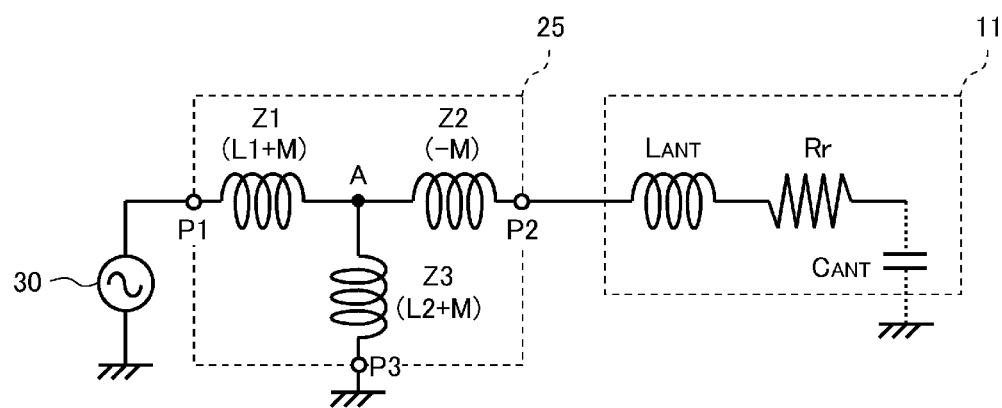
FIG. 1B is an equivalent circuit diagram of the antenna device 101.

FIG. 1A is a circuit diagram of an antenna device 101 including a first matching circuit 25 for preliminarily describing an impedance converting circuit of a first preferred embodiment of the present invention. FIG. 1B is an equivalent circuit diagram of the antenna device 101.

As illustrated in FIG. 1A, the antenna device 101 includes a radiating element 11 and the first matching circuit connected to the radiating element 11. The radiating element 11 preferably is a monopole antenna. The first matching circuit is connected to a feeding end of the radiating element 11. The first matching circuit (or strictly, a first inductance element L1 of the first matching circuit) is interposed between the radiating element 11 and a feeding circuit 30. The feeding circuit 30 is provided to feed a high-frequency signal to the radiating element 11. The feeding circuit 30 generates and processes high-frequency signals, and may include a circuit that multiplexes and demultiplexes high-frequency signals.

The first matching circuit includes the first inductance element L1 connected to the feeding circuit 30, and a second inductance element L2 coupled to the first inductance element L1. More specifically, a first end and a second end of the first inductance element L1 are connected to the feeding circuit 30 and the radiating element 11, respectively, and a first end and a second end of the second inductance element L2 are connected to the radiating element 11 and a ground, respectively.

The first inductance element L1 and the second inductance element L2 are tightly coupled (or transformer-coupled) to each other. This generates an equivalent negative inductance component. Since the negative inductance component cancels an inductance component of the radiating element 11, the inductance component of the radiating element 11 is reduced. That is, since an effective inductive reactance component of the radiating element 11 is reduced, the radiating element 11 becomes less dependent on the frequency of high-frequency signals.

The first matching circuit includes a transformer circuit in which the first inductance element L1 and the second inductance element L2 are coupled to each other through a mutual inductance M. As illustrated in FIG. 1B, the transformer circuit can be equivalently transformed into a T-type circuit including three inductance elements Z1, Z2, and Z3. Specifically, the T-type circuit includes a first port P1 connected to a high-frequency circuit, a second port P2 connected to the radiating element 11, a third port P3 connected to the ground, a first inductance element Z1 connected between the first port P1 and a branch point A, a second inductance element Z2 connected between the second port P2 and the branch point A, and a third inductance element Z3 connected between the third port P3 and the branch point A.

As illustrated in FIG. 1B, an inductance of the first inductance element Z1 can be expressed as L1+M, an inductance of the second inductance element Z2 can be expressed as −M, and an inductance of the third inductance element Z3 can be expressed as L2+M, where L1 represents an inductance of the first inductance element L1, L2 represents an inductance of the second inductance element L2, and M represents a mutual inductance illustrated in FIG. 1A. The inductance of the second inductance element Z2 has a negative value, regardless of the values of L1 and L2. That is, an equivalent negative inductance component is generated here.

As illustrated in FIG. 1B, the radiating element 11 is equivalently defined by an inductance component $L_{ANT}$, a radiation resistance component Rr, and a capacitance component $C_{ANT}$. The inductance component $L_{ANT}$ of the radiating element 11 alone acts to be cancelled by the negative inductance component (−M) in the first matching circuit 25. That is, the inductance component (of the radiating element 11 including the second inductance element Z2), as viewed from the point A in the impedance converting circuit to the radiating element 11, is reduced (ideally to zero), which reduces the impedance frequency characteristic of the antenna device 106.

To generate a negative inductance component as described above, it is important that the first inductance element and the second inductance element be coupled to each other with a high degree of coupling. Specifically, the degree of coupling is preferably about 0.1 or greater, and more preferably about 0.5 or greater, for example, depending on the element values of the inductance elements. That is, with this configuration, a very high degree of coupling, such as that in the first preferred embodiment, is not necessarily required.

The T-type circuit illustrated in FIG. 1B can be divided into the following portions: a portion (Z2 and $L_{ANT}$) that cancels the inductive reactance as viewed from the branch point A to the radiating element 11, and a portion (Z1 and Z3) that converts an impedance formed between the point P connected to the high-frequency circuit and the third port P3 connected to the branch point A and the ground.

Figure 2:
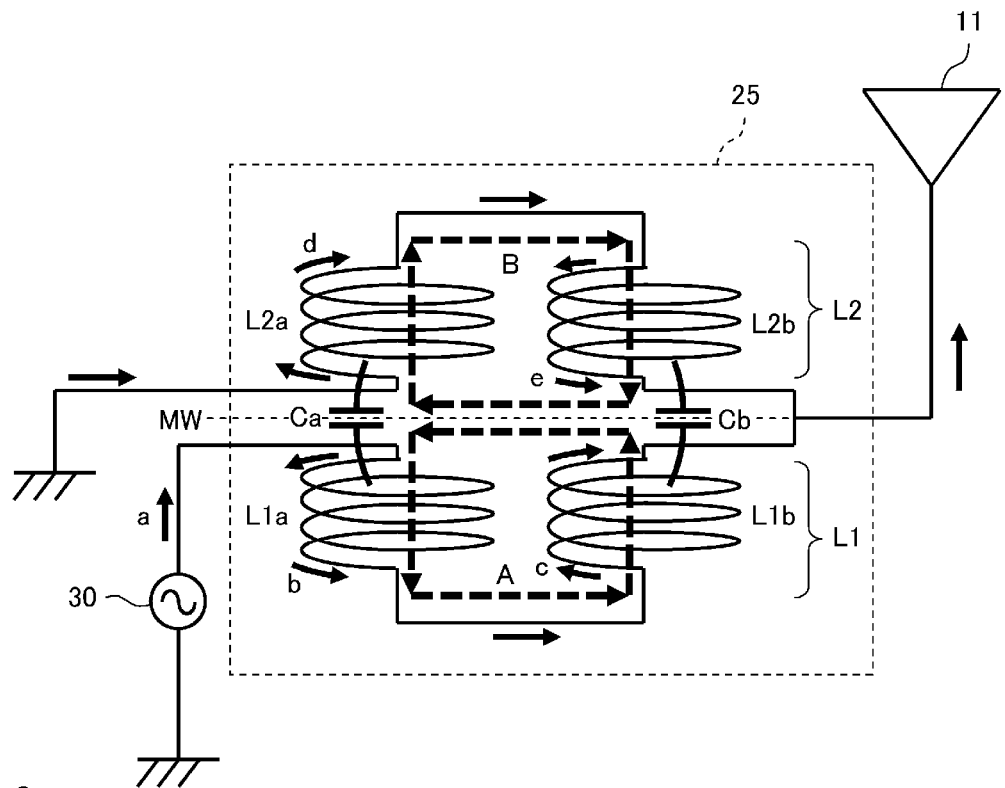
FIG. 2 is a specific circuit diagram of the antenna device 101, the diagram illustrating a specific configuration for coupling a first inductance element and a second inductance element to each other, with a high degree of coupling.

FIG. 2 is a specific circuit diagram of the antenna device 101. FIG. 2 illustrates a specific configuration for coupling the first inductance element and the second inductance element to each other, with a high degree of coupling.

As illustrated in FIG. 2, the first inductance element L1 includes a first coil element L1a and a second coil element L1b, which are connected in series to each other and wound to define a closed magnetic path. The second inductance element L2 includes a third coil element L2a and a fourth coil element L2b, which are connected in series to each other and wound to define a closed magnetic path. In other words, the first coil element L1a and the second coil element L1b are coupled to each other in opposite phase (or coupled in additive polarity), and the third coil element L2a and the fourth coil element L2b are coupled to each other in opposite phase (or coupled in additive polarity).

As illustrated in FIG. 2, when a current is supplied from the high-frequency circuit in the direction of arrow "a" in the drawing, a current flows in the first coil element L1a in the direction of arrow "b" in the drawing and, at the same time, a current flows in the coil element L1b in the direction of arrow "c" in the drawing. These currents generate a magnetic flux (that passes through a closed magnetic path), as indicated by arrow A in the drawing.

Since the coil element L1a and the coil element L2a are parallel to each other, a magnetic field generated by flow of the current b in the coil element L1a is coupled to the coil element L2a and an induced current d flows in the coil element L2a in the opposite direction. Similarly, since the coil element L1b and the coil element L2b are parallel or substantially parallel to each other, a magnetic field generated by flow of the current c in the coil element L1b is coupled to the coil element L2b and an induced current e flows in the coil element L2b in the opposite direction. These currents generate a magnetic flux that passes through a closed magnetic path, as indicated by arrow B in the drawing.

The closed magnetic path for the magnetic flux A generated in the first inductance element L1, including the coil elements L1a and L1b, and the closed magnetic path for the magnetic flux B generated in the second inductance element L2, including the coil elements L1b and L2b, are independent of each other. Therefore, an equivalent magnetic wall MW is generated between the first inductance element L1 and the second inductance element L2.

The coil element L1a and the coil element L2a are coupled to each other also through an electric field. Similarly, the coil element L1b and the coil element L2b are coupled to each other also through an electric field. Therefore, when alternating current signals flow in the coil element L1a and the coil element L1b, the electric-field coupling excites a current in each of the coil element L2a and the coil element L2b. Capacitors Ca and Cb in FIG. 2 each symbolically represent a coupling capacitance for the electric-field coupling.

When an alternating current flows in the first inductance element L1, a direction of a current that flows in the second inductance element L2 as a result of the coupling through the magnetic field is the same as a direction of a current that flows in the second inductance element L2 as a result of the coupling through the electric field. Therefore, the first inductance element L1 and the second inductance element L2 are strongly coupled to each other through both the magnetic field and the electric field.

The first matching circuit may also be defined as a circuit configured such that, when an alternating current flows in the first inductance element L1, a direction of a current that flows in the second inductance element L2 as a result of coupling through a magnetic field is the same as a direction of a current that flows in the second inductance element L2 as a result of coupling through an electric field.

Figure 3:
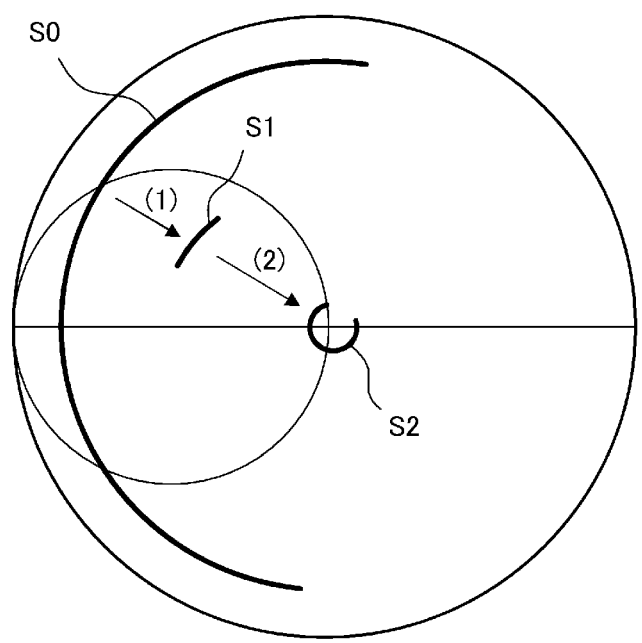
FIG. 3 schematically illustrates an effect of an equivalent negative inductance component in a first matching circuit and an effect of the first matching circuit.

FIG. 3 schematically illustrates an effect of the equivalent negative inductance component in the first matching circuit and an effect of the first matching circuit. In FIG. 3, a curve S0 on the Smith chart represents a locus of impedance obtained by sweeping the frequency over a frequency band used by the radiating element 11. Since the inductance component $L_{ANT}$ of the radiating element 11 alone is relatively large, the impedance changes significantly as shown in FIG. 2.

A curve S1 in FIG. 3 represents a locus of impedance as viewed from the point A in the impedance converting circuit illustrated in FIG. 1B to the radiating element 11. As shown, the equivalent negative inductance component of the impedance converting circuit cancels the inductance component $L_{ANT}$ of the radiating element, so that the locus of impedance as viewed from the point A to the radiating element is significantly reduced.

A curve S2 in FIG. 3 represents a locus of impedance as viewed from the feeding circuit 30, that is, a locus of impedance of the antenna device 101. As shown, the impedance of the antenna device 101 becomes closer to 50Ω (the center of the Smith chart) depending on the ratio of impedance conversion performed by the transformer circuit (L1: L2). A fine adjustment of the impedance is made by the matching circuits to be described below.

Thus, the magnitude of change in impedance of the antenna device can be reduced over a wide band. Therefore, it is possible to provide impedance matching between a high-frequency circuit and a radiating element over a wide frequency band.

An antenna device 101A including the impedance converting circuit according to the first preferred embodiment of the present invention will now be described with reference to FIG. 4A to FIG. 8.

Figure 4A:
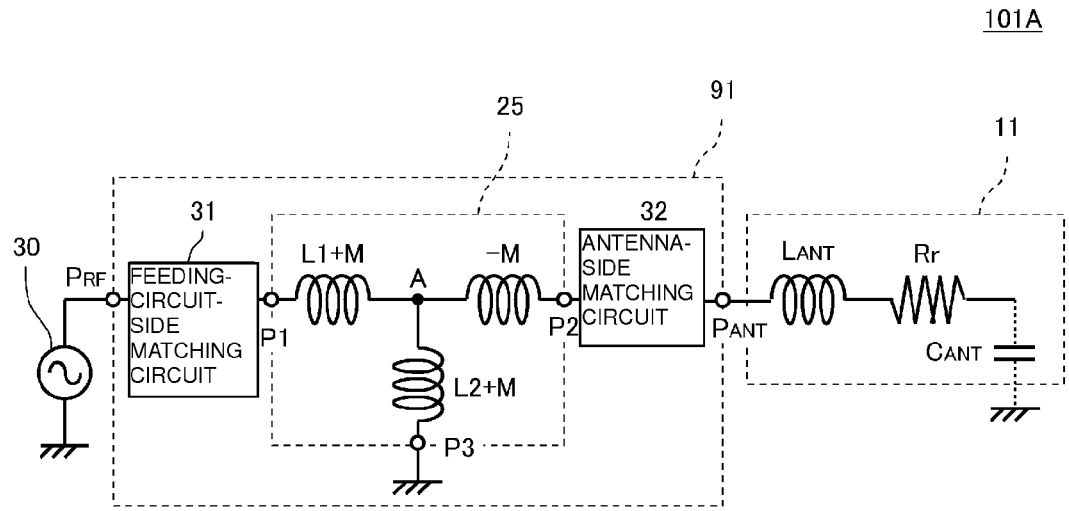
FIG. 4A is a circuit diagram of an impedance converting circuit module 91 including second matching circuits before and after the first matching circuit, and an antenna device 101A including the impedance converting circuit module 91.

FIG. 4A is a circuit diagram of an impedance converting circuit module 91 including second matching circuits before and after the first matching circuit 25, and the antenna device 101A including the impedance converting circuit module 91. The impedance converting circuit module 91 corresponds to "impedance converting circuit" of a preferred embodiment of the present invention. The first matching circuit 25 and the radiating element 11 are represented by the equivalent circuit illustrated in FIG. 1B.

The feeding-circuit-side matching circuit 31 performs impedance matching between a feeding port P of the feeding circuit 30 and the first matching circuit 25, and the antenna-side matching circuit 32 performs impedance matching between a port of the radiating element 11 and the first matching circuit 25. The feeding circuit 30 corresponds to a "first high-frequency circuit" of a preferred embodiment of the present invention, and the radiating element 11 corresponds to a "second high-frequency circuit" of a preferred embodiment of the present invention. The feeding-circuit-side matching circuit 31 and the antenna-side matching circuit 32 correspond to a "second matching circuit" of a preferred embodiment of the present invention.

Figure 4B:
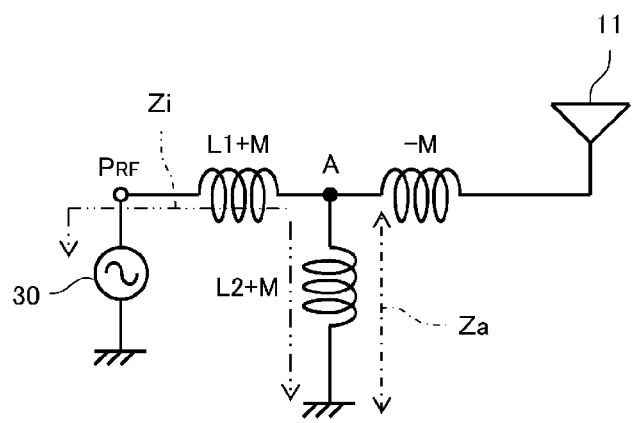
FIG. 4B is a diagram for describing a feeding-circuit-side matching circuit 31, an antenna-side matching circuit 32, and an impedance conversion ratio (transformation ratio).

FIG. 4B is a diagram for describing the first matching circuit 25 and an impedance conversion ratio (transformation ratio).

By setting the negative inductance "−M" in FIG. 4B to be approximately equal to (≈) the inductance of "the antenna-side matching circuit $32+L_{ANT}$", the radiation resistor Rr of the first radiating element 11 can be seen when the inductance adjacent to the radiating element 11 is viewed from the point A.

A characteristic impedance from the point A to the ground is L2+M. The antenna-side matching circuit 32 performs impedance matching such that the real portion of the impedance "L2+M" is approximately equal to (≈) the impedance "Rr" of the radiating element 11.

A characteristic impedance from the input port P1 of the first matching circuit 25 to the ground, illustrated in FIG. 4A, can be expressed as L1+M+L2+M=L1+L2+2M. The feeding-circuit-side matching circuit 31 performs impedance matching such that an impedance viewed from the feeding port P of the feeding circuit 30 is a characteristic impedance of the feeding circuit 30.

The impedance conversion ratio (transformation ratio) of the first matching circuit 25 is (L1+L2+2M):(L2+M).

Figure 5:
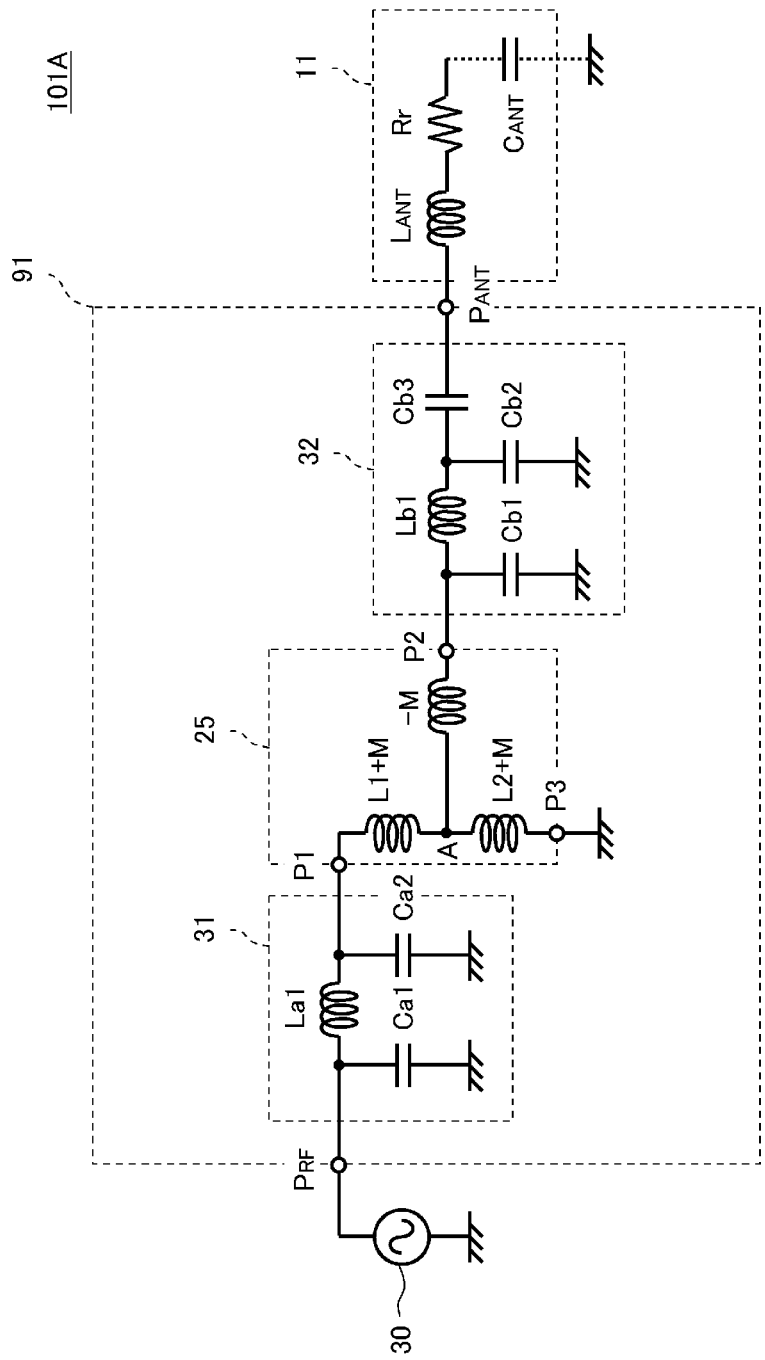
FIG. 5 illustrates an example of specific circuits of the impedance converting circuit module.

FIG. 5 illustrates an example of specific circuits of the impedance converting circuit module.

The feeding-circuit-side matching circuit 31 includes an inductance element La1 located in a line that connects the feeding port $P_{RF}$ and the connecting port P1 adjacent to the feeding circuit 30, a capacitance element Ca1 shunt-connected to one side of the inductance element La1 adjacent to the feeding circuit 30, and a capacitance element Ca2 shunt-connected to the other side of the inductance element La1 adjacent to the first matching circuit 25. These matching circuit elements define a so-called π-type matching circuit.

The antenna-side matching circuit 32 includes an inductance element Lb1 located in a line that connects the port P2 of the first matching circuit 25 and an input/output port $P_{ANT}$, a capacitance element Cb1 shunt-connected to one side of the inductance element Lb1 adjacent to the first matching circuit 25, and a capacitance element Cb2 shunt-connected to the other side of the inductance element Lb1 adjacent to the radiating element 11. These matching circuit elements define a so-called π-type matching circuit. The antenna-side matching circuit 32 further includes a matching circuit element defined by a capacitance element Cb3 located in the line that connects the port P2 of the first matching circuit 25 and the input/output port $P_{ANT}$.

Figure 6A:
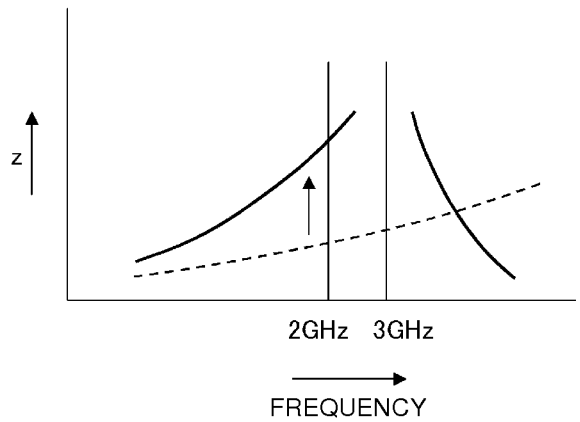
FIG. 6A illustrates an example in which the slope of change in impedance with frequency is increased at around 2 GHz in a high band.

FIG. 6A illustrates an example in which, when a parallel resonance frequency by the capacitor Cb1 of the antenna-side matching circuit 32 and the inductance element L2+M−M=L2 illustrated in FIG. 5 is set to, for example, 3 GHz, the slope of change in impedance with frequency is increased at around 2 GHz in a high band. In FIG. 6A, a broken curve represents a characteristic of the inductance element L2, and solid curves represent a characteristic of the parallel resonant circuit.

Figure 6B:
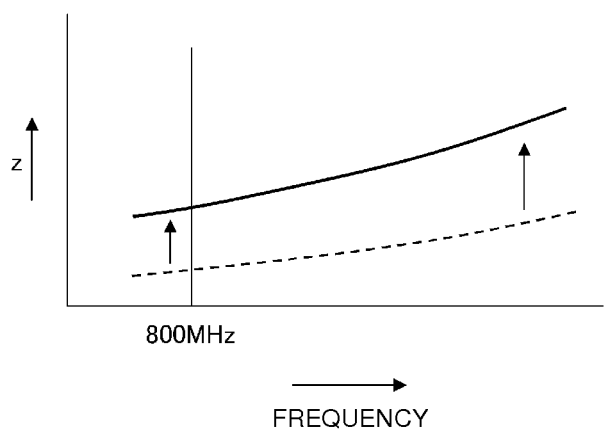
FIG. 6B illustrates an example in which the impedance is increased at around 800 MHz in a low band without a significant increase in the slope of change in impedance with frequency.

FIG. 6B illustrates an example in which, when a parallel resonance frequency by the capacitor Ca2 of the feeding-circuit-side matching circuit 31 and the inductance elements L1+M+L2+M=L1+L2+2M illustrated in FIG. 5 is set to, for example, 4 GHz (i.e., the capacitance of the capacitor Ca2 is set to be smaller than that of the capacitor Cb1), the impedance is increased at around 800 MHz in a low band without a significant increase in the slope of change in impedance with frequency.

The real portion of the impedance of the radiating element 11 does not significantly change with frequency in a low band, but changes with increasing frequency with a relatively large slope in a high band. Thus, the feeding-circuit-side matching circuit 31 can provide matching in a low band, and the antenna-side matching circuit 32 can provide matching in a high band.

Of the two capacitors (Cb1 and Ca2) described above, one having a larger capacitance can determine the frequency characteristic of the impedance ratio in a high band. Therefore, the first matching circuit disposed before the first matching circuit may perform matching in a high band, and the second matching circuit disposed after the first matching circuit may perform matching in a low band.

Figure 7:
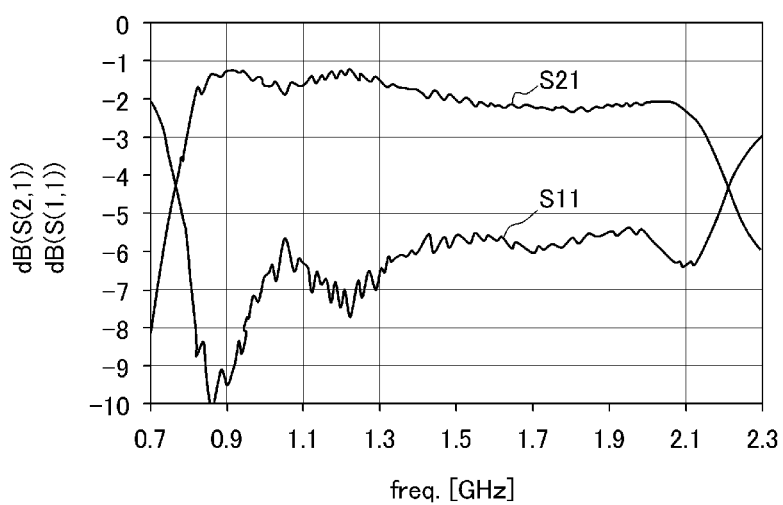
FIG. 7 illustrates a transmission characteristic S21 and a reflection characteristic S11 as viewed from a feeding port $P_{RF}$ of the antenna device 101A illustrated in FIG. 5.

FIG. 7 illustrates a transmission characteristic S21 and a reflection characteristic S11 as viewed from the feeding port $P_{RF}$ of the antenna device 101A illustrated in FIG. 5. As illustrated, low insertion loss and low reflection characteristics are achieved over a range from an 800 MHz band (low band) to a 2 GHz band (high band).

Figure 8:
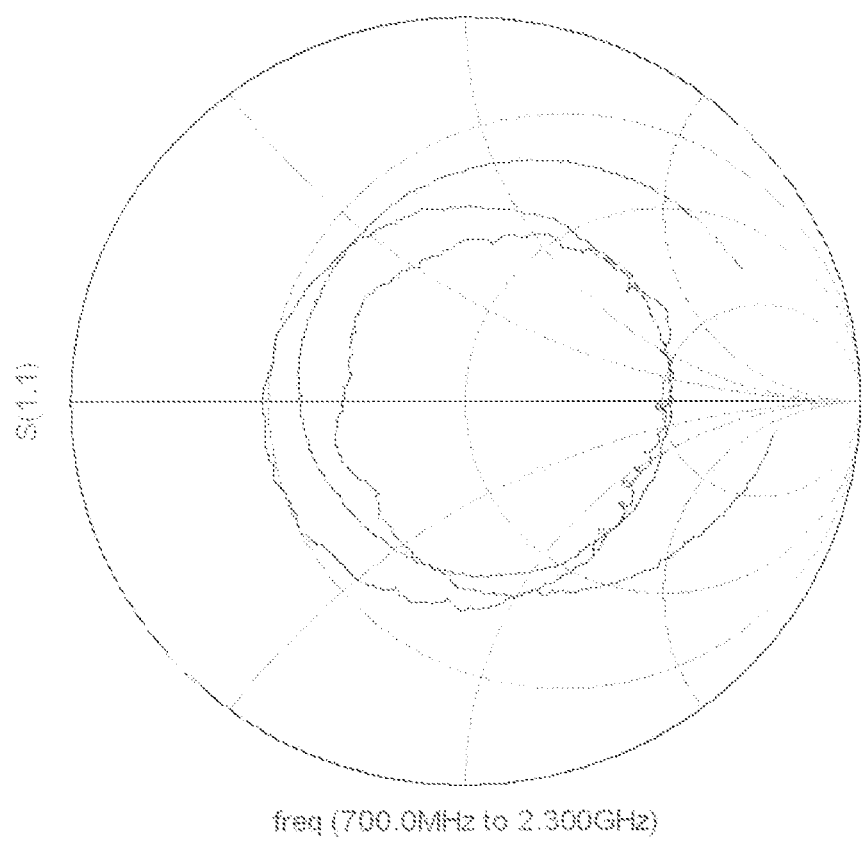
FIG. 8 illustrates a locus of impedance obtained by sweeping the frequency from 700 MHz to 2.3 GHz, as viewed from the feeding port $P_{RF}$ to the antenna.

FIG. 8 illustrates a locus of impedance obtained by sweeping the frequency from 700 MHz to 2.3 GHz, as viewed from the feeding port $P_{RF}$ to the antenna. As illustrated, the locus of impedance runs around the center of the Smith chart. This indicates that matching is achieved over a wide frequency range.

Second Preferred Embodiment

A description of a second preferred embodiment of the present invention explains a configuration of inductance elements and an impedance converting circuit module different from those of the first preferred embodiment.

Figure 9A:
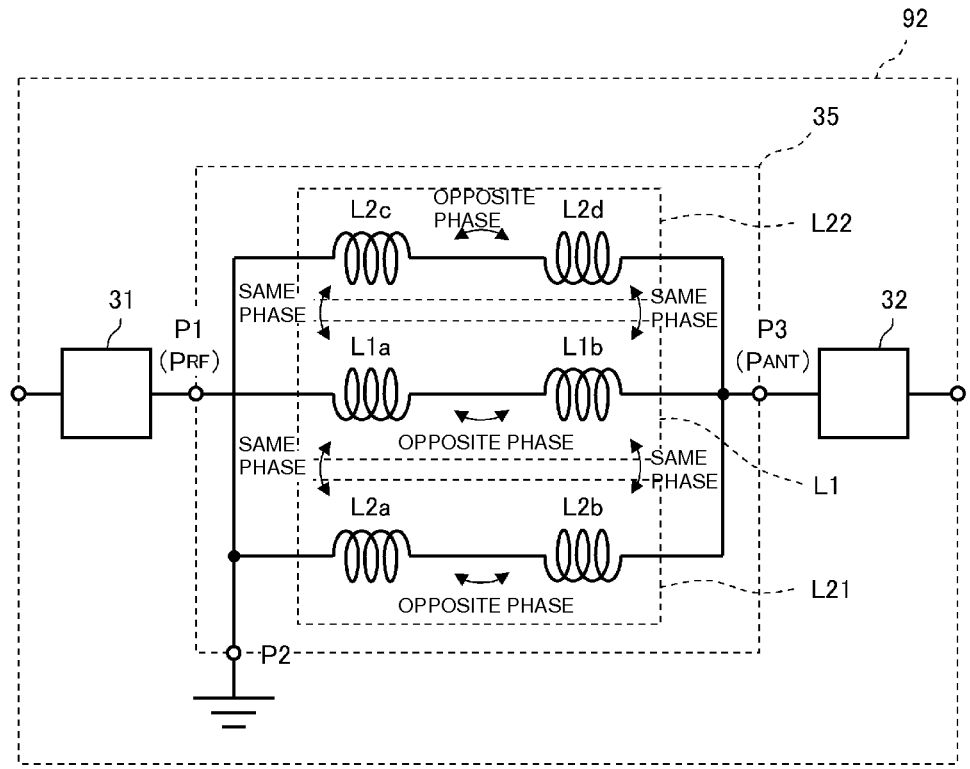
FIG. 9A is a circuit diagram of an antenna device according to a second preferred embodiment of the present invention.

FIG. 9A is a circuit diagram of an impedance converting circuit module according to the second preferred embodiment. A first matching circuit 35 included in the second preferred embodiment includes the first inductance element L1 and two second inductance elements L21 and L22. The first inductance element L1 includes the first coil element L1a and the second coil element L1b. The second inductance element L21 includes the third coil element L2a and the fourth coil element L2b. The other second inductance element L22 includes a third coil element L2c and a fourth coil element L2d.

Figure 9B:
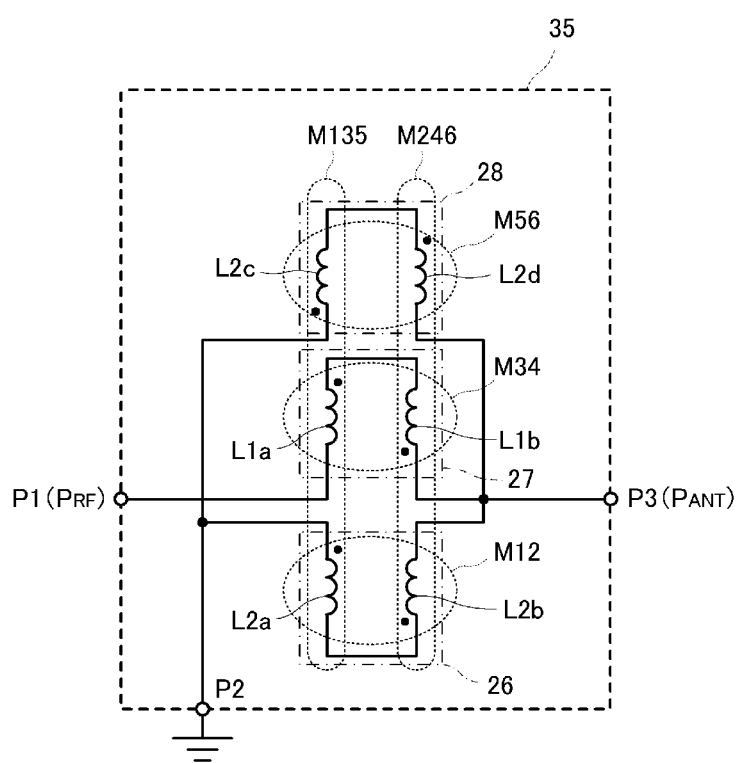
FIG. 9B is a circuit diagram specifically illustrating an arrangement of coil elements of the antenna device 102 according to the second preferred embodiment of the present invention.

FIG. 9B is a circuit diagram specifically illustrating an arrangement of the coil elements of an impedance converting circuit according to the second preferred embodiment. A first series circuit 26 is a circuit in which the third coil element L2a and the fourth coil element L2b are connected in series. A second series circuit 27 is a circuit in which the first coil element L1a and the second coil element L1b are connected in series. A third series circuit 28 is a circuit in which the other third coil element L2c and the other fourth coil element L2d are connected in series.

In FIG. 9B, circle M34 indicates coupling between the coil elements L1a and L1b, circle M12 indicates coupling between the coil elements L2a and L2b, and circle M56 indicates coupling between the coil elements L2c and L2d. Also, circle M135 indicates coupling of the coil elements L1a, L2a, and L2c. Similarly, circle M246 indicates coupling of the coil elements L1b, L2b, and L2d.

Figure 10:
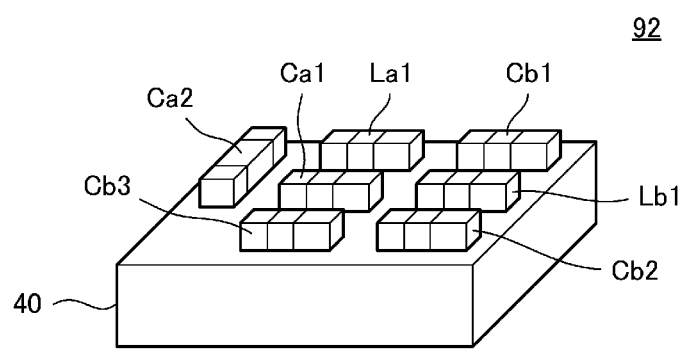
FIG. 10 is a perspective view of an impedance converting circuit module 92 according to the second preferred embodiment of the present invention.

FIG. 10 is a perspective view of an impedance converting circuit module 92 according to the second preferred embodiment. The first matching circuit 35 illustrated in FIG. 9 is provided in a dielectric or magnetic laminated body (core). The chip components Ca1, Ca2, Cb1, Cb2, Cb3, La1, and Lb1 that define the first and second matching circuits 31 and 32 are mounted on an upper surface of the laminated body. The first and second matching circuits 31 and 32 are the same as those illustrated in FIG. 5. The impedance converting circuit module 92 and the radiating element form an antenna device.

Figure 11:
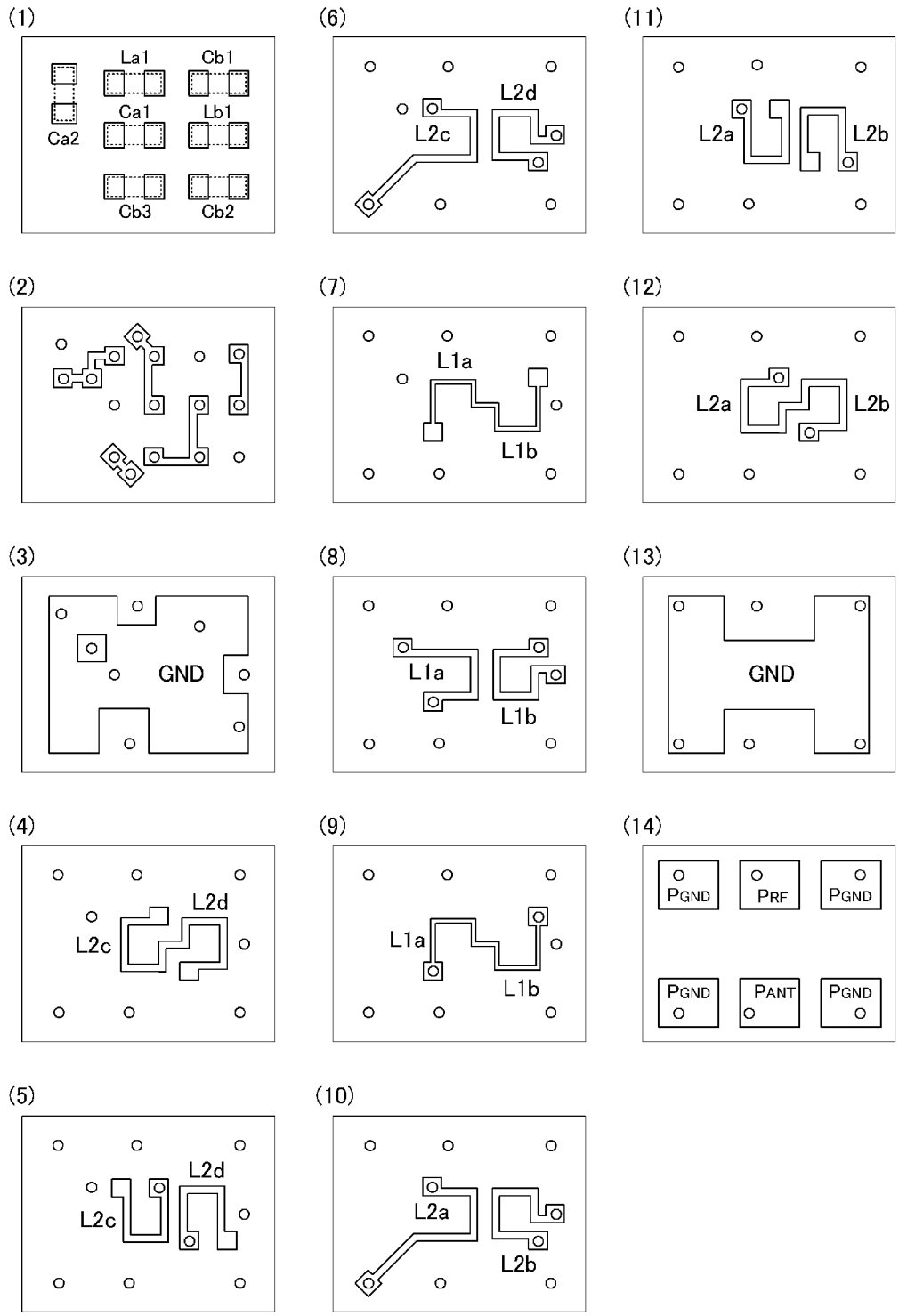
FIG. 11 is an exploded plan view of a laminated body of the impedance converting circuit module 92.
Figure 12:
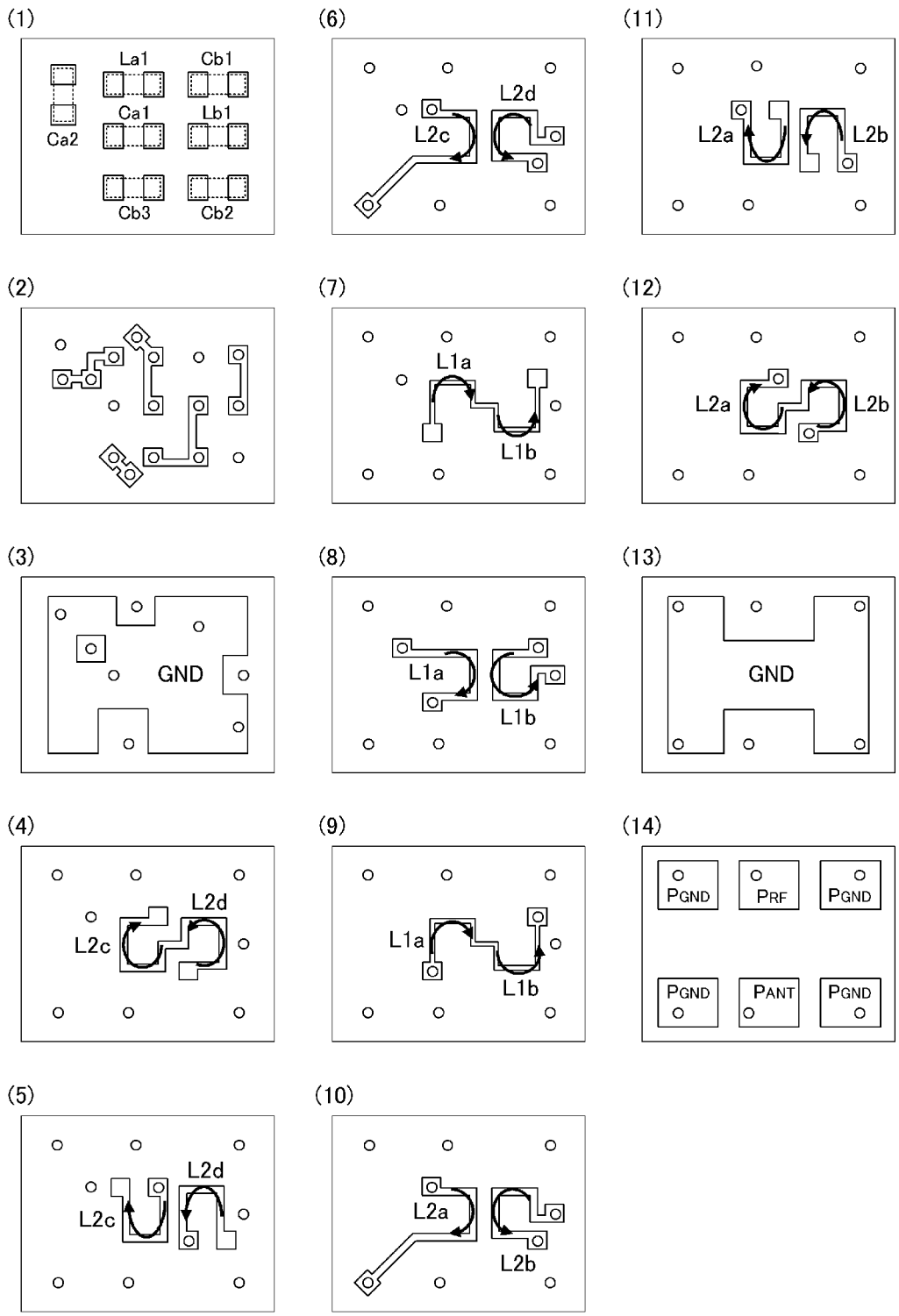
FIG. 12 illustrates directions of currents that flow in coil elements when a current is flowing from a high-frequency circuit to a radiating element.

FIG. 11 is an exploded plan view of a laminated body of the impedance converting circuit module 92. FIG. 12 illustrates directions of currents that flow in coil elements when a current is flowing from a high-frequency circuit to a radiating element. Each layer of the laminated body is preferably defined either by a dielectric sheet or a magnetic sheet. A conductive pattern is provided on each layer. A base material layer (1) and a base material layer (14) in FIG. 11 are sheets of the uppermost layer and the bottom layer, respectively. As for the base material layer (14), FIG. 11 illustrates a pattern of external electrodes provided on a lower surface of the laminated body after formation of the laminated body.

Referring to FIG. 11, electrode pads to mount the respecting chip components are provided on the base material layer (1). A ground conductor GND is provided on each of base material layers (3) and (13). Conductive traces of the coil elements L2c and L2d are provided on each of base material layers (4) to (6), conductive traces of the coil elements L1a and L1b are provided on each of base material layers (7) to (9), and conductive traces of the coil elements L2a and L2b are provided on each of base material layers (10) to (12). The feeding terminal $P_{RF}$, the antenna terminal $P_{ANT}$, and ground terminals $P_{GND}$ are provided on the lower surface of the laminated body. Each base material layer is provided with inter-layer wiring conductors (via-hole conductors) to connect the coil elements, ground conductors, and chip components.

More specifically, as illustrated in FIG. 11 and FIG. 12, the input/output terminal electrode $P_{RF}$ on the back surface of the dielectric core is connected, through via-hole conductors and in-plane wiring conductors of each base material layer, to one end of the chip inductor La1 and one end of the chip capacitor Ca1 mounted on the front surface of the dielectric core. The other end of the chip inductor La1 is connected, through in-plane wiring conductors and via-hole conductors, to one end of the chip capacitor Ca2 and one end of the conductive trace of the coil element L1a (hereinafter simply referred to as "coil trace") on the base material layer (8). The other end of the chip capacitor Ca1 and the other end of the chip capacitor Ca2 is connected, through in-plane wiring conductors and via-hole conductors, to the ground conductor GND on the base material layer (3). The other end of the coil trace L1a on the base material layer (8) is connected to one end of the coil trace L1a on the base material layer (7) and one end of the coil trace L1a on the base material layer (9). The other end of the coil trace L1a on the base material layer (7) and the other end of the coil trace L1a on the base material layer (9) are connected to one end of the coil trace L1b on the base material layer (7) and one end of the coil trace L1b on the base material layer (9), respectively. The other end of the coil trace L1b on the base material layer (7) and the other end of the coil trace L1b on the base material layer (9) are connected to one end of the coil trace L1b on the base material layer (8). The coil trace L1a and the coil trace L1b are wound such that the directions of currents flowing in these coils are opposite each other. In other words, the coil trace L1a and the coil trace L1b are wound to define a closed magnetic path.

The other end of the coil trace L1b on the base material layer (8) is connected, through via-hole conductors and in-plane wiring conductors, to one end of the chip inductor Lb1 and one end of the chip capacitor Cb1, one end of the coil trace L2b on the base material layer (10), and one end of the coil trace L2d on the base material layer (6). The other end of the coil trace L2b on the base material layer (10) is connected through a via-hole conductor to one end of the coil trace L2b on the base material layer (11), and the other end of the coil trace L2b on the base material layer (11) is connected through a via-hole conductor to one end of the coil trace L2b on the base material layer (12). The other end of the coil trace L2d on the base material layer (6) is connected through a via-hole conductor to one end of the coil trace L2d on the base material layer (5), and the other end of the coil trace L2d on the base material layer (5) is connected through a via-hole conductor to one end of the coil trace L2d on the base material layer (4).

The other end of the coil trace L2b on the base material layer (12) is connected to one end of the coil trace L2a on the base material layer (12), and the other end of the coil trace L2a on the base material layer (12) is connected through a via-hole conductor to one end of the coil trace L2a on the base material layer (11). The other end of the coil trace L2a on the base material layer (11) is connected through a via-hole conductor to one end of the coil trace L2a on the base material layer (12). Similarly, the other end of the coil trace L2d on the base material layer (4) is connected to one end of the coil trace L2c on the same base material layer (4), and the other end of the coil trace L2c on the base material layer (4) is connected through a via-hole conductor to one end of the coil trace L2c on the base material layer (5). The other end of the coil trace L2c on the base material layer (5) is connected through a via-hole conductor to one end of the coil trace L2c on the base material layer (6). Thus, the coil trace L2c and the coil trace L2d are wound such that the directions of currents flowing in these coils are opposite each other. In other words, the coil trace L2c and the coil trace L2d are wound to define a closed magnetic path. Also, the coil trace L2a and the coil trace L2b are wound such that the directions of currents flowing in these coils are opposite each other. In other words, the coil trace L2a and the coil trace L2b are wound to define a closed magnetic path. The other end of the coil trace L2a on the base material layer (10)

and the other end of the coil trace L2c on the base material layer (6) are connected, through via-hole conductors, to the ground conductor on the base material layer (3) and the ground conductor on the base material layer (13).

The other end of the coil trace L1b on the base material layer (8), one end of the coil trace L2b on the base material layer (10), and one end of the coil trace L2d on the base material layer (6) are connected, through via-hole conductors and in-plane wiring conductors, to one end of the chip inductor Lb1 and one end of the chip capacitor Cb1 mounted on the front surface of the dielectric core. The other end of the chip inductor Lb1 is connected, through via-hole conductors and in-plane wiring conductors, to one end of the chip capacitor Cb2 and one end of the chip capacitor Cb3 mounted on the front surface of the dielectric core. The other end of the chip capacitor Cb1 and the other end of the chip capacitor Cb2 are connected through via-hole conductors to the ground conductor on the base material layer (3). The other end of the chip capacitor Cb3 is connected through via-hole conductors and in-plane wiring conductors to the antenna terminal $P_{ANT}$ on the back surface of the laminated body.

The ground conductor on the base material layer (3) is connected through via-hole conductors to the ground conductor on the base material layer (13), and the ground conductor GND on the base material layer (13) is connected to four ground terminal electrodes $P_{GND}$ on the base material layer (14).

Thus, the coil trace L1a is interposed between the coil trace L2a and the coil trace L2c. The coil trace L1a, the coil trace L2a, and the coil trace L2c are arranged to overlap one another as viewed in plan view in the lamination direction. Similarly, the coil trace L1b is interposed between the coil trace L2b and the coil trace L2d. The coil trace L1b, the coil trace L2b, and the coil trace L2d are arranged to overlap one another as viewed in plan view in the lamination direction. Additionally, these coil traces are interposed between the ground conductor on the base material layer (3) and the ground conductor on the base material layer (13). As illustrated in FIG. 12, if a current flows from the high-frequency circuit to the radiating element (i.e., if a current flows in from $P_{RF}$), a current flows in the coil trace L1a in the direction of arrow in the drawing and also flows in the coil trace L1b in the direction of arrow in the drawing, so that the coil trace L1a and the coil trace L1b define a closed magnetic path. Similarly, currents flow in the coil trace L2a and the coil trace L2c in the directions of arrows in the drawing, and currents also flow in the coil trace L2b and the coil trace L2d in the directions of arrows in the drawing, so that the coil trace L2a and the coil trace L2b define a closed magnetic path and the coil trace L2c and the coil trace L2d also define a closed magnetic path. The closed magnetic path of the coil trace L1a and the coil trace L1b is arranged to repel the closed magnetic path of the coil trace L2a and the coil trace L2b and the closed magnetic path of the coil trace L2c and the coil trace L2d (i.e., such that magnetic fluxes are generated in the same direction). Therefore, a magnetic wall is provided between adjacent closed magnetic paths.

Third Preferred Embodiment

Figure 13A:
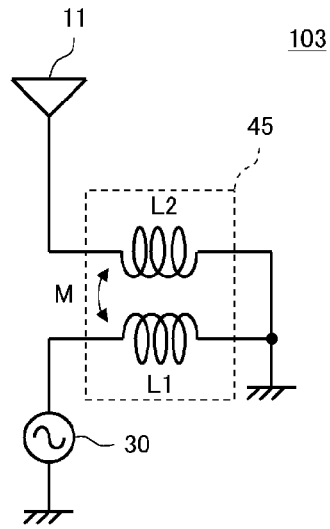
FIG. 13A illustrates a basic configuration of an antenna device 103 according to a third preferred embodiment of the present invention.
Figure 13B:
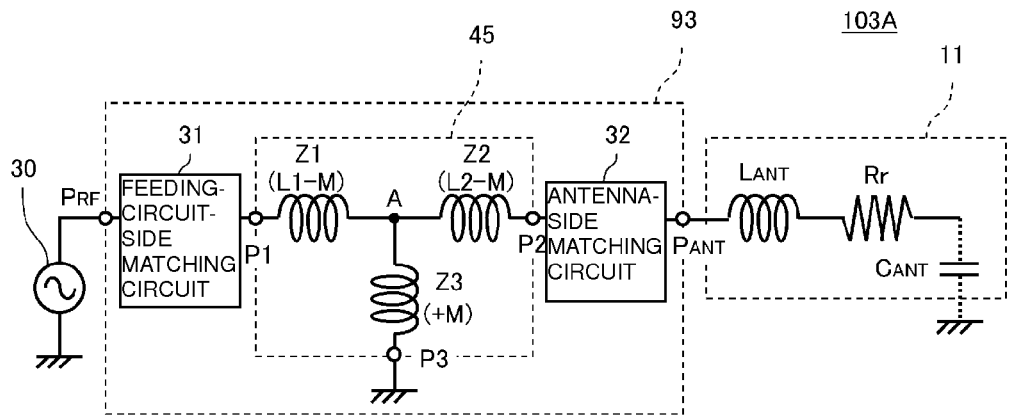
FIG. 13B is a circuit diagram of an impedance converting circuit module 93 including second matching circuits before and after a first matching circuit 45 of the third preferred embodiment of the present invention, and an antenna device 103A including the impedance converting circuit module 93.

FIG. 13A is a circuit diagram of an antenna device 103 including a first matching circuit 45 for preliminarily describing an impedance converting circuit of a third preferred embodiment of the present invention. FIG. 13B is a circuit diagram of an impedance converting circuit module including second matching circuits before and after the first matching circuit 45, and an antenna device 103A including the impedance converting circuit module according to the third preferred embodiment.

As illustrated in FIG. 13A, the antenna device 103 includes the radiating element 11 and the first matching circuit 45 connected to the radiating element 11. The radiating element 11 preferably is a monopole antenna. The first matching circuit is connected to a feeding end of the radiating element 11. The first matching circuit 45 is interposed between the radiating element 11 and the feeding circuit 30. The feeding circuit 30 is a high-frequency circuit that feeds a high-frequency signal to the radiating element 11. The feeding circuit 30 generates and processes high-frequency signals, and may include a circuit that multiplexes and demultiplexes high-frequency signals.

The first matching circuit 45 includes the first inductance element L1 connected to the feeding circuit 30, and the second inductance element L2 coupled to the first inductance element L1. More specifically, a first end and a second end of the first inductance element L1 are connected to the feeding circuit 30 and the ground, respectively, and a first end and a second end of the second inductance element L2 are connected to the radiating element 11 and the ground, respectively.

The first inductance element L1 and the second inductance element L2 are coupled to each other. This generates an equivalent negative inductance component. Since the negative inductance component cancels an inductance component of the radiating element 11, the inductance component of the radiating element 11 is small. That is, since an effective inductive reactance component of the radiating element 11 is reduced, the radiating element 11 becomes less dependent on the frequency of high-frequency signals.

The first matching circuit 45 includes a transformer circuit in which the first inductance element L1 and the second inductance element L2 are coupled to each other through the mutual inductance M. As illustrated in FIG. 13B, the transformer circuit can be equivalently transformed into a T-type circuit including three inductance elements Z1, Z2, and Z3. Specifically, the T-type circuit includes the first port P1 connected to the high-frequency circuit, the second port P2 connected to the radiating element 11, the third port P3 connected to the ground, the first inductance element Z1 connected between the first port P1 and the branch point, the second inductance element Z2 connected between the second port P2 and the branch point A, and the third inductance element Z3 connected between the third port P3 and the branch point A.

As illustrated in FIG. 13B, an inductance of the first inductance element Z1 can be expressed as L1−M, an inductance of the second inductance element Z2 can be expressed as L2−M, and an inductance of the third inductance element Z3 can be expressed as +M, where L1 represents an inductance of the first inductance element L1, L2 represents an inductance of the second inductance element L2, and M represents a mutual inductance illustrated in FIG. 13A. If the relationship L2<M is satisfied, the inductance of the second inductance element Z2 has a negative value. That is, an equivalent negative composite inductance component is generated here.

As illustrated in FIG. 13B, the radiating element 11 is equivalently defined by the inductance component $L_{ANT}$, the radiation resistance component Rr, and the capacitance component $C_{ANT}$. The inductance component $L_{ANT}$ of the radiating element 11 alone acts to be cancelled by the negative inductance component (L2−M) in the first matching circuit 45. That is, the inductance component (of the radiating element 11 including the second inductance element Z2), as viewed from the point A in the impedance converting circuit to the radiating element 11, is reduced (ideally to zero), which reduces the impedance frequency characteristic of the antenna device 103.

To generate a negative inductance component as described above, it is important that the first inductance element and the second inductance element be coupled to each other with a high degree of coupling. Specifically, it is only necessary that the degree of coupling be about 1 or more, for example.

The ratio of impedance conversion performed by the transformer circuit is the ratio of the inductance L1 of the first inductance element L1 to the mutual inductance M (L1:M).

Thus, the impedance converting circuit module 93 including the first matching circuit 45 of transformer type, where the first inductance element L1 is on a primary side and the second inductance element L2 is on a secondary side, can be configured in the same manner as the first preferred embodiment.

In FIG. 13B, the feeding-circuit-side matching circuit 31 performs impedance matching between the feeding port $P_{RF}$ of the feeding circuit 30 and the first matching circuit 45, and the antenna-side matching circuit 32 performs impedance matching between a port of the radiating element 11 and the first matching circuit 45. The feeding circuit 30 corresponds to a "first high-frequency circuit" of a preferred embodiment of the present invention, and the radiating element 11 corresponds to a "second high-frequency circuit" of a preferred embodiment of the present invention. The feeding-circuit-side matching circuit 31 and the antenna-side matching circuit 32 correspond to a "second matching circuit" of a preferred embodiment of the present invention.

Fourth Preferred Embodiment

Figure 14:
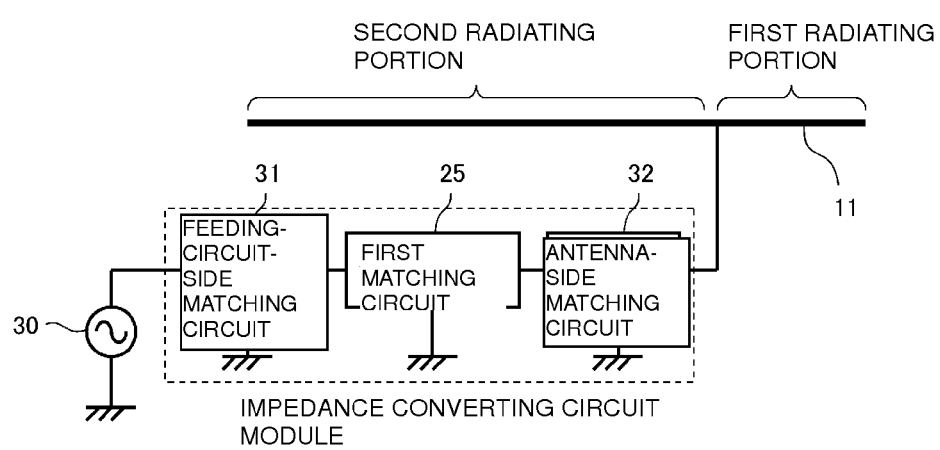
FIG. 14 is a circuit diagram of an antenna device 104 according to a fourth preferred embodiment of the present invention.

FIG. 14 is a circuit diagram of an antenna device 104 according to a fourth preferred embodiment of the present invention. The radiating element does not have to be a monopole antenna, and may be an antenna having a configuration such as that illustrated in FIG. 14. The antenna device 104 preferably is an antenna device used in multiband mobile radio communication systems (800 MHz band, 900 MHz band, 1800 MHz band, and 1900 MHz band) that can support GSM (registered trademark) and CDMA. The radiating element 11 preferably is a branched monopole antenna.

The antenna device 104 is preferably used as a main antenna of a communication terminal apparatus. A first radiating portion of the radiating element 11 of branched monopole type mainly acts as an antenna radiating element for a high band (1800 MHz to 2400 MHz), and both the first radiating portion and a second radiating portion mainly act as an antenna radiating element for a low band (800 MHz to 900 MHz). The radiating element 11 of branched monopole type does not necessarily have to resonate in the frequency bands. This is because the first matching circuit matches the characteristic impedance of each of the radiating portions to the impedance of the feeding circuit 30. For example, in the 800 MHz to 900 MHz band, the first matching circuit 25 matches the characteristic impedance of each of the first radiating portion and the second radiating portion to the impedance (typically 50Ω) of the feeding circuit 30. Thus, high-frequency signals in a low band supplied from the feeding circuit 30 can be radiated from the first radiating portion and the second radiating portion, or high-frequency signals in a low band received by the first radiating portion and the second radiating portion can be supplied to the feeding circuit 30. Similarly, high-frequency signals in a high band supplied from the feeding circuit 30 can be radiated from the first radiating portion, or high-frequency signals in a high band received by the first radiating portion can be supplied to the feeding circuit 30.

Fifth Preferred Embodiment

A fifth preferred embodiment of the present invention provides an example of a communication terminal apparatus.

Figure 15A:
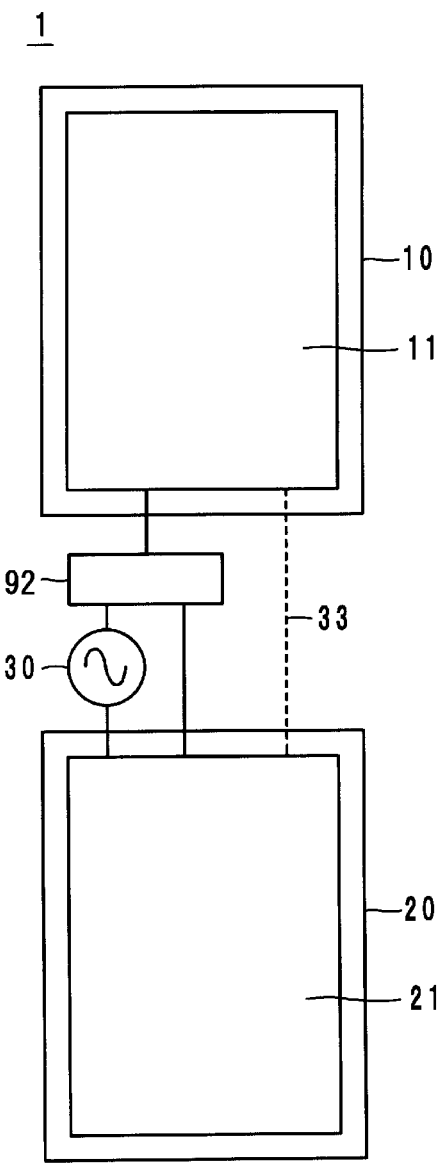
FIG. 15A illustrates a configuration of a communication terminal apparatus which is a first example of a fifth preferred embodiment of the present invention.
Figure 15B:
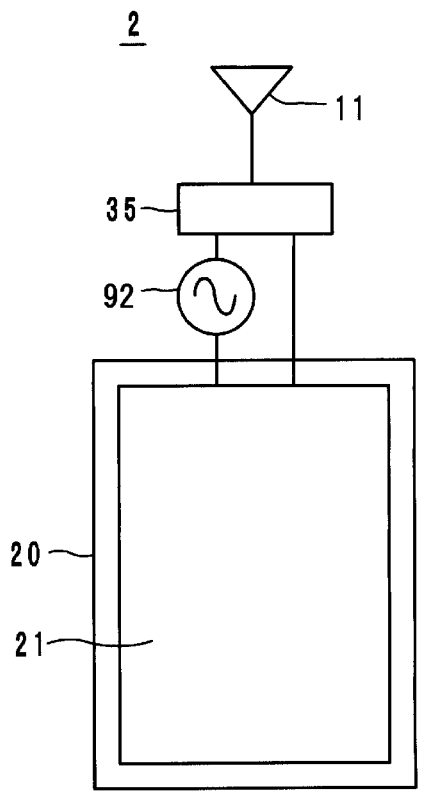
FIG. 15B illustrates a configuration of a communication terminal apparatus which is a second example of the fifth preferred embodiment of the present invention.

FIG. 15A illustrates a configuration of a communication terminal apparatus which is a first example of the fifth preferred embodiment. FIG. 15B illustrates a configuration of a communication terminal apparatus which is a second example of the fifth preferred embodiment. These communication terminal apparatuses are, for example, terminals for receiving high-frequency signals (470 MHz to 770 MHz) in a one-segment partial reception service (commonly referred to as "One seg") for cellular phones and mobile terminals.

A communication terminal apparatus 1 illustrated in FIG. 15A includes a first housing 10 serving as a cover and a second housing 20 serving as a main body. The first housing 10 is foldably or slidably coupled to the second housing 20. The first housing 10 includes a first radiating element 11 serving also as a ground plate, and the second housing 20 includes a second radiating element 21 serving also as a ground plate. The first and second radiating elements 11 and 21 preferably include conductive films which are, for example, thin films of metal foil and others or thick films made from conductive paste and others. Differential feeding from the feeding circuit 30 allows the first and second radiating elements 11 and 21 to achieve substantially the same performance as that of a dipole antenna. The feeding circuit 30 includes a signal processing circuit, such as an RF circuit or a baseband circuit.

An inductance value of the impedance converting circuit module 92 is preferably smaller than an inductance value of a connecting line 33 that connects the two radiating elements 11 and 21. This is to reduce the effect of the inductance value of the connecting line 33 on frequency characteristics.

A communication terminal apparatus 2 illustrated in FIG. 15B includes the first radiating element 11 alone as an antenna. Various radiating elements, such as a chip antenna, a sheet metal antenna, and a coil antenna, can be used as the first radiating element 11. The radiating element may be, for example, a wire conductor arranged along the inner periphery or outer periphery of the housing 10. The second radiating element 21 serves also as a ground plate of the second housing 20. Like the first radiating element 11, various antennas may be used as the second radiating element 21. The communication terminal apparatus 2 preferably is a terminal having a straight structure, and is not a terminal of either folding or sliding type. The second radiating element 21 does not necessarily have to sufficiently serve as a radiating body. The first radiating element 11 may act like a so-called monopole antenna.

The feeding circuit 30 is connected at one end to the second radiating element 21, and connected at the other end through the impedance converting circuit module 92 to the first radiating element 11. The first and second radiating elements 11 and 21 are connected to each other by the connecting line 33. The connecting line 33 serves as a line to connect electronic components (not shown) mounted on the first and second housings 10 and 20. Although the connecting line 33 acts as an inductance element on high-frequency signals, this has no direct effect on the antenna performance.

The impedance converting circuit module 92 is interposed between the feeding circuit 30 and the first radiating element 11. The impedance converting circuit module 92 stabilizes the frequency characteristics of high-frequency signals transmitted from or received by the first and second radiating elements 11 and 21. Thus, the frequency characteristics of the high-frequency signals are stabilized without being affected by the shapes of the first and second radiating elements 11 and 21, the shapes of the first and second housings 10 and 20, the arrangement of neighboring components and others. Particularly in the communication terminal apparatus of folding type or sliding type, the impedances of the first and second radiating elements 11 and 21 tend to vary depending on whether the first housing 10 serving as a cover is open or closed with respect to the second housing 20 serving as a main body. However, as described above, the impedance converting circuit module 92 can stabilize the frequency characteristics of high-frequency signals. Specifically, the impedance converting circuit module 92 can carry out frequency-characteristic adjusting functions (such as setting of a center frequency, setting of a passband width, and setting of impedance matching) which are important for antenna design. For the radiating elements, it is only necessary to take mainly the directivity and gain into consideration. This can simplify the antenna design.

Sixth Preferred Embodiment

A sixth preferred embodiment of the present invention provides examples of impedance converting circuit modules having different configurations of matching circuits and others.

Figure 16A:
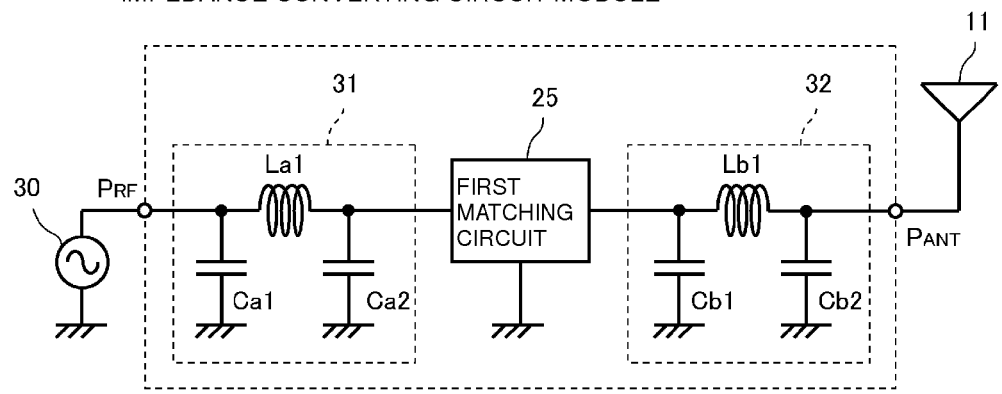
FIG. 16A and FIG. 16B are each a circuit diagram of an impedance converting circuit module according to a sixth preferred embodiment of the present invention.
Figure 16B:
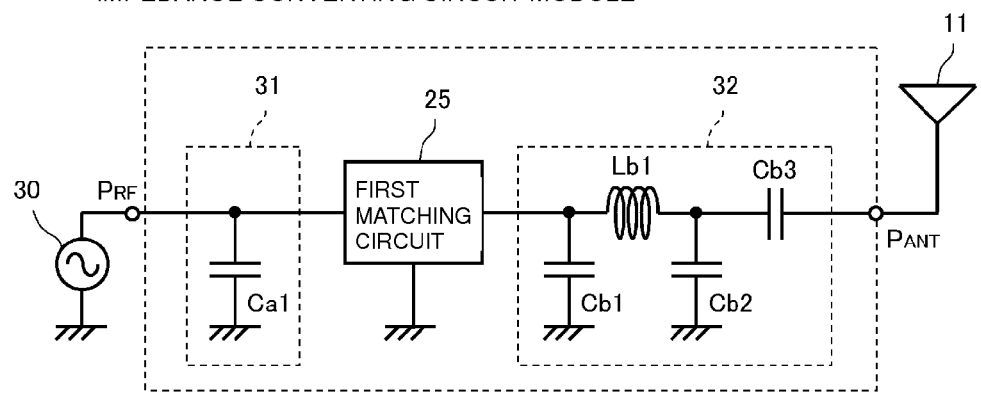
Figure 17:
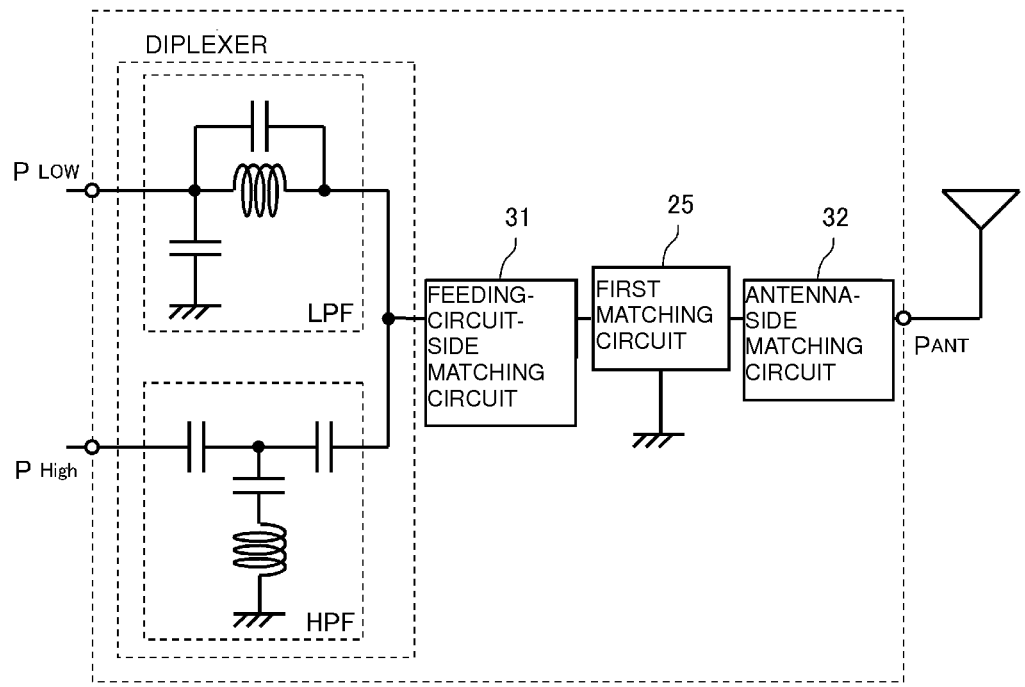
FIG. 17 is another circuit diagram of an impedance converting circuit module according to the sixth preferred embodiment of the present invention.

FIG. 16A and FIG. 16B are each a circuit diagram of an impedance converting circuit module according to the sixth preferred embodiment. FIG. 17 is another circuit diagram of an impedance converting circuit module according to the sixth preferred embodiment.

As illustrated in FIG. 16A, both the feeding-circuit-side matching circuit 31 and the antenna-side matching circuit 32 in the impedance converting circuit module may be π-type matching circuits. Alternatively, as illustrated in FIG. 16B, the feeding-circuit-side matching circuit 31 may be provided only by a shunt-connected capacitance element. The impedance converting circuit may include the feeding-circuit-side matching circuit 31 alone or the antenna-side matching circuit 32 alone. Various matching circuits, such as a T-type matching circuit, an LC parallel matching circuit, and an LC series matching circuit, can be used as the second matching circuits.

As illustrated in FIG. 17, the module may include a diplexer having a low-pass filter and a high-pass filter. Inductance elements and capacitance elements that define the low-pass filter and the high-pass filter may be disposed inside a dielectric or magnetic laminated body (core), or mounted as chip components on the surface of the laminated body.

Seventh Preferred Embodiment

A seventh preferred embodiment of the present invention provides an example of another conductive pattern of an impedance converting circuit module.

Figure 18:
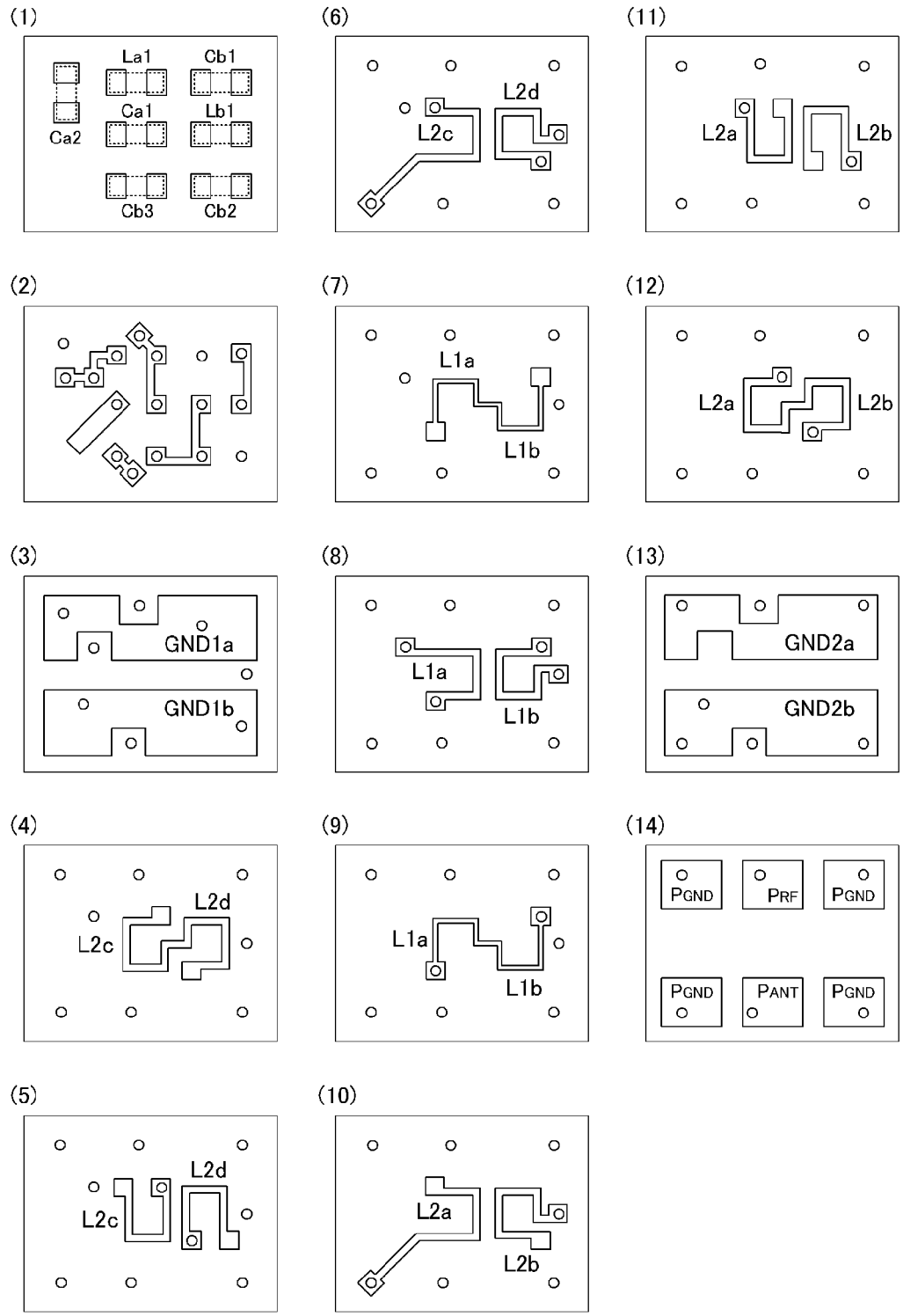
FIG. 18 is an exploded plan view of a laminated body forming an impedance converting circuit module according to a seventh preferred embodiment of the present invention.

FIG. 18 is an exploded plan view of a laminated body defining an impedance converting circuit module according to the seventh preferred embodiment. A difference from the example illustrated in FIG. 11 is the configuration of ground conductor patterns on the base material layers (3) and (13). The other configurations preferably are basically the same as those illustrated in FIG. 11.

The ground conductor on the base material layer (3) is divided into two portions GND1$a$ and GND1$b$, and the ground conductor on the on the base material layer (13) is divided into two portions GND2$a$ and GND2$b$. As illustrated, each ground conductor preferably includes a slit that runs across coil traces. In other words, it is preferable, in plan view, that the ground conductor corresponding to the coil trace L2$a$ and the coil trace L2$c$ be divided into two, and that the ground conductor corresponding to the coil trace L2$b$ and the coil trace L2$d$ be divided into two.

In the structure described above, when a current flows in a coil trace, the resulting flow of an induced current in a ground conductor may reduce the Q value of the coil. However, since the ground conductor is divided in this structure, it is possible to significantly reduce and prevent the reduction of the Q value.

Eighth Preferred Embodiment

In the examples illustrated in FIG. 11 and FIG. 18, the chip capacitance elements and the chip inductance elements, which are reactance elements of the second matching circuits, are preferably mounted on the surface of the dielectric or magnetic laminated body (core). However, together with the first inductance element and the second inductance element defining the first matching circuit, the reactance elements defining the second matching circuits may be disposed inside the dielectric or magnetic laminated body (core). An eighth preferred embodiment describes this example.

Figure 19:
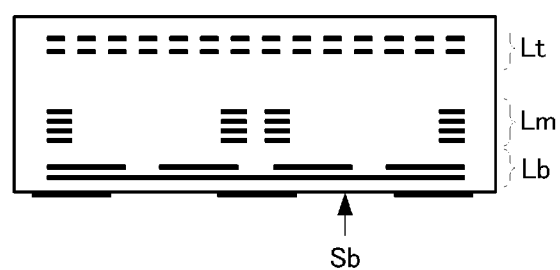
FIG. 19 is a cross-sectional view of a laminated body forming an impedance converting circuit module according to an eighth preferred embodiment of the present invention.

FIG. 19 is a cross-sectional view of a laminated body defining an impedance converting circuit module according to the eighth preferred embodiment. The laminated body includes a bottom surface (mounting surface) Sb with various input/output terminals provided thereon, a lower layer portion Lb, a middle layer portion Lm, and an upper layer portion Lt.

When the first matching circuit and the second matching circuits are provided inside the laminated body, it is preferable that the first matching circuit including the first inductance element and the second inductance element be disposed in the middle layer portion Lm of the laminated body, electrodes that define the capacitance elements shunt-connected to the ground in the second matching circuits be disposed in the lower layer portion Lb of the laminated body, and the inductance elements connected in series to the line in the second matching circuits be disposed in the upper layer portion Lt of the laminated body.

In this structure, when a ground electrode is disposed in the lower layer portion of the laminated body, the electrodes that define the capacitance elements are close to the ground electrode, so that the length of wiring trough via conductors is reduced. Since this can reduce unwanted inductance components of the via conductors, desired capacitance components can be provided by small electrodes to define the capacitance elements. Also, when the inductance elements are disposed in the upper layer portion, the inductance components of via conductors connected between the upper layer portion and the input/output terminals can be effectively used, so that a size reduction is achieved.

To minimize unwanted coupling between the first and second inductance elements in the middle layer portion and the inductance elements in the upper layer portion, it is preferable to increase the distance between them.

In the eighth preferred embodiment, unlike in the case where chip components are mounted on the laminated body, there is no effect of lot-to-lot variations in characteristics of the chip components. Also, the impedance converting circuit can be obtained with a smaller cost increase than in the case of forming the first matching circuit on the laminated body, so that a cost reduction is achieved.

Although the present invention has been described on the basis of the preferred embodiments thereof, the present invention is not limited to the preferred embodiments described above.

The impedance converting circuit connected between the feeding circuit, which is a first high-frequency circuit, and the antenna element (radiating element), which is a second high-frequency circuit, has been described above. However, the first high-frequency circuit is not limited to the feeding circuit and the second high-frequency circuit is not limited to the antenna element. Also, "first high-frequency circuit" is not limited to a circuit including a plurality of circuit elements, and may be a single circuit element. Similarly, "second high-frequency circuit" is not limited to a circuit including a plurality of circuit elements, and may be a single circuit element. The present invention is applicable also to, for example, an impedance converting circuit which is disposed on an output side of a high-frequency amplifying IC having an impedance higher than that of a 50-Ω transmission line and provides impedance matching between the high-frequency amplifying IC and the transmission line. The impedance converting circuit of various preferred embodiments of the present invention can be used for impedance conversion in various types of high-frequency circuit elements.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An impedance converting circuit connected between a feeding circuit and a radiating element, the impedance converting circuit comprising:
    a first matching circuit including a first inductance element that includes a first end and a second end connected to the feeding circuit and the radiating element, respectively, and a second inductance element that includes a first end and a second end connected to the radiating element and a ground, respectively, the first inductance element and the second inductance element are transformer-coupled to each other; and
    a second matching circuit connected at least between the first matching circuit and the feeding circuit or between the first matching circuit and the radiating element, the second matching circuit including a reactance element including at least one of a capacitance element and an inductance element; wherein
    the first inductance element and the second inductance element are coupled to each other through a magnetic field and an electric field;
    the reactance element in the second matching circuit includes at least a capacitance element that defines a parallel resonant circuit together with the first inductance element or the second inductance element;
    the second matching circuit includes a first matching circuit element including a first capacitance element shunt-connected between the first matching circuit and the feeding circuit, and a second matching circuit element including a second capacitance element shunt-connected between the first matching circuit and the radiating element; and
    one of the first capacitance element and the second capacitance element that has a larger capacitance performs impedance matching of high-frequency signals mainly in a first frequency band, and the other of the first capacitance element and the second capacitance element that has a smaller capacitance performs impedance matching of high-frequency signals mainly in a second frequency band, where frequencies of the high-frequency signals in the first frequency band are lower than frequencies of the high-frequency signals in the second frequency band.

2. The impedance converting circuit according to claim 1, wherein the first inductance element and the second inductance element are located in a laminated body including a plurality of dielectric layers or magnetic layers stacked on each other, and the reactance element is mounted on a surface of the laminated body as a chip capacitance element or as a chip inductance element.

3. The impedance converting circuit according to claim 1, wherein the first inductance element, the second inductance element, and the reactance element are located in a laminated body including a plurality of dielectric layers or magnetic layers stacked on each other.

4. The impedance converting circuit according to claim 1, wherein an equivalent negative inductance component is generated by the first inductance element and the second inductance element that are coupled to each other, and the negative inductance component reduces an effective inductance component of the radiating element.

5. The impedance converting circuit according to claim 4, wherein
    the first matching circuit includes a transformer circuit in which the first inductance element and the second inductance element are coupled to each other through a mutual inductance; and
    when the transformer circuit is equivalently transformed into a T-type circuit including a first port connected to a high-frequency circuit, a second port connected to the radiating element, a third port connected to a ground, an inductance element connected between the first port and a branch point, another inductance element connected between the second port and the branch point, and another inductance element connected between the third port and the branch point, the equivalent negative inductance component corresponds to the inductance element connected between the branch point and the second port.

6. The impedance converting circuit according to claim 1, wherein a first end of the first inductance element is connected to the feeding circuit, a second end of the first inductance element is connected to a ground, a first end of the second inductance element is connected to the radiating element, and a second end of the second inductance element is connected to the ground.

7. The impedance converting circuit according to claim 1, wherein the first inductance element includes a first coil element and a second coil element, the first coil element and the second coil element are connected in series to each other, and a conductive winding pattern of the first coil element and the second coil element is arranged to define a closed magnetic path.

8. The impedance converting circuit according to claim 1, wherein the second inductance element includes a first coil element and a second coil element, the first coil element and the second coil element are connected in series to each other, and a conductive winding pattern of the first coil element and the second coil element is arranged to define a closed magnetic path.

9. The impedance converting circuit according to claim 1, wherein when an alternating current flows in the first inductance element, a direction of a current that flows in the second inductance element as a result of the coupling through the magnetic field is the same as a direction of a current that flows in the second inductance element as a result of the coupling through the electric field.

10. The impedance converting circuit according to claim 1, wherein when an alternating current flows in the first inductance element, a direction of a current that flows in the second inductance element is a direction in which a magnetic wall is generated between the first inductance element and the second inductance element.

11. A communication terminal apparatus comprising:
a radiating element; and
the impedance converting circuit recited in claim 1.

12. The communication terminal apparatus according to claim 11, wherein the first inductance element and the second inductance element are located in a laminated body including a plurality of dielectric layers or magnetic layers stacked on each other, and the reactance element is mounted on a surface of the laminated body as a chip capacitance element or as a chip inductance element.

13. The communication terminal apparatus according to claim 11, wherein the first inductance element, the second inductance element, and the reactance element are located in a laminated body including a plurality of dielectric layers or magnetic layers stacked on each other.

14. The communication terminal apparatus according to claim 11, wherein an equivalent negative inductance component is generated by the first inductance element and the second inductance element that are coupled to each other, and the negative inductance component reduces an effective inductance component of the radiating element.

15. The communication terminal apparatus according to claim 14, wherein
the first matching circuit includes a transformer circuit in which the first inductance element and the second inductance element are coupled to each other through a mutual inductance; and
when the transformer circuit is equivalently transformed into a T-type circuit including a first port connected to a high-frequency circuit, a second port connected to the radiating element, a third port connected to a ground, an inductance element connected between the first port and a branch point, another inductance element connected between the second port and the branch point, and another inductance element connected between the third port and the branch point, the equivalent negative inductance component corresponds to the inductance element connected between the branch point and the second port.

16. An impedance converting circuit connected between a feeding circuit and a radiating element, the impedance converting circuit comprising:
a first matching circuit including a first inductance element that includes a first end and a second end connected to the feeding circuit and the radiating element, respectively, and a second inductance element that includes a first end and a second end connected to the radiating element and a ground, respectively, the first inductance element and the second inductance element are transformer-coupled to each other; and
a second matching circuit connected at least between the first matching circuit and the feeding circuit or between the first matching circuit and the radiating element, the second matching circuit including a reactance element including at least one of a capacitance element and an inductance element; wherein
the first inductance element and the second inductance element are coupled to each other through a magnetic field and an electric field; and
the first inductance element and the second inductance element are located in a laminated body including a plurality of dielectric layers or magnetic layers stacked on each other, and the reactance element is mounted on a surface of the laminated body as a chip capacitance element or as a chip inductance element.

17. An impedance converting circuit connected between a feeding circuit and a radiating element, the impedance converting circuit comprising:
a first matching circuit including a first inductance element that includes a first end and a second end connected to the feeding circuit and the radiating element, respectively, and a second inductance element that includes a first end and a second end connected to the radiating element and a ground, respectively, the first inductance element and the second inductance element are transformer-coupled to each other; and
a second matching circuit connected at least between the first matching circuit and the feeding circuit or between the first matching circuit and the radiating element, the second matching circuit including a reactance element including at least one of a capacitance element and an inductance element; wherein
the first inductance element and the second inductance element are coupled to each other through a magnetic field and an electric field; and
the first inductance element, the second inductance element, and the reactance element are located in a laminated body including a plurality of dielectric layers or magnetic layers stacked on each other.

18. An impedance converting circuit connected between a feeding circuit and a radiating element, the impedance converting circuit comprising:
a first matching circuit including a first inductance element that includes a first end and a second end connected to the feeding circuit and the radiating element, respectively, and a second inductance element that includes a first end and a second end connected to the radiating element and a ground, respectively, the first inductance element and the second inductance element are transformer-coupled to each other; and
a second matching circuit connected at least between the first matching circuit and the feeding circuit or between the first matching circuit and the radiating element, the second matching circuit including a reactance element including at least one of a capacitance element and an inductance element; wherein
the first inductance element and the second inductance element are coupled to each other through a magnetic field and an electric field;
an equivalent negative inductance component is generated by the first inductance element and the second inductance element that are coupled to each other, and the negative inductance component reduces an effective inductance component of the radiating element;

the first matching circuit includes a transformer circuit in which the first inductance element and the second inductance element are coupled to each other through a mutual inductance; and when the transformer circuit is equivalently transformed into a T-type circuit including a first port connected to a high-frequency circuit, a second port connected to the radiating element, a third port connected to a ground, an inductance element connected between the first port and a branch point, another inductance element connected between the second port and the branch point, and another inductance element connected between the third port and the branch point, the equivalent negative inductance component corresponds to the inductance element connected between the branch point and the second port.

19. An impedance converting circuit connected between a feeding circuit and a radiating element, the impedance converting circuit comprising:

a first matching circuit including a first inductance element that includes a first end and a second end connected to the feeding circuit and the radiating element, respectively, and a second inductance element that includes a first end and a second end connected to the radiating element and a ground, respectively, the first inductance element and the second inductance element are transformer-coupled to each other; and a second matching circuit connected at least between the first matching circuit and the feeding circuit or between the first matching circuit and the radiating element, the second matching circuit including a reactance element including at least one of a capacitance element and an inductance element; wherein the first inductance element and the second inductance element are coupled to each other through a magnetic field and an electric field; and when an alternating current flows in the first inductance element, a direction of a current that flows in the second inductance element as a result of the coupling through the magnetic field is the same as a direction of a current that flows in the second inductance element as a result of the coupling through the electric field.

20. An impedance converting circuit connected between a feeding circuit and a radiating element, the impedance converting circuit comprising:

a first matching circuit including a first inductance element that includes a first end and a second end connected to the feeding circuit and the radiating element, respectively, and a second inductance element that includes a first end and a second end connected to the radiating element and a ground, respectively, the first inductance element and the second inductance element are transformer-coupled to each other; and a second matching circuit connected at least between the first matching circuit and the feeding circuit or between the first matching circuit and the radiating element, the second matching circuit including a reactance element including at least one of a capacitance element and an inductance element; wherein the first inductance element and the second inductance element are coupled to each other through a magnetic field and an electric field; and when an alternating current flows in the first inductance element, a direction of a current that flows in the second inductance element is a direction in which a magnetic wall is generated between the first inductance element and the second inductance element.

* * * * *